(12) United States Patent
Aeschbacher

(10) Patent No.: US 7,131,861 B2
(45) Date of Patent: Nov. 7, 2006

(54) CONNECTION DEVICE FOR FLEXIBLE CIRCUIT

(75) Inventor: Michel Aeschbacher, Saint Prest (FR)

(73) Assignee: FCI, Versailles (FR)

( * ) Notice: Subject to any disclaimer, the term of this patent is extended or adjusted under 35 U.S.C. 154(b) by 0 days.

(21) Appl. No.: 10/519,317

(22) PCT Filed: Jun. 18, 2003

(86) PCT No.: PCT/FR03/01857

§ 371 (c)(1),
(2), (4) Date: Oct. 11, 2005

(87) PCT Pub. No.: WO04/001906

PCT Pub. Date: Dec. 31, 2003

(65) Prior Publication Data

US 2006/0099849 A1    May 11, 2006

(30) Foreign Application Priority Data

Jun. 24, 2002   (FR) .................................. 02 07802

(51) Int. Cl.
*H01R 12/24* (2006.01)

(52) U.S. Cl. ........................................ 439/495; 439/67
(58) Field of Classification Search ................ 439/495, 439/493, 492, 498, 496, 499, 67, 632
See application file for complete search history.

(56) References Cited

U.S. PATENT DOCUMENTS

| 3,082,398 A | 5/1960 | Valach ........................ 439/496 |
| 3,065,446 A | 11/1962 | Robb et al. .................. 439/496 |
| 3,629,787 A * | 12/1971 | Wilson ......................... 439/67 |
| 4,938,713 A | 7/1990 | Daly et al. ................... 439/492 |
| 4,975,080 A | 12/1990 | Daly et al. ................... 439/498 |
| 5,730,619 A | 3/1998 | Hamlin ........................ 439/493 |
| 6,074,220 A | 6/2000 | Roberts ....................... 439/67 |

* cited by examiner

*Primary Examiner*—Javaid H. Nasri
(74) *Attorney, Agent, or Firm*—Harrington & Smith, LLP

(57) ABSTRACT

The subject of the invention is a connection device for a flex circuit (12), comprising a support (16), means (18) for positioning flex circuit (12) relative to said support (16) and conformation means (20) for flex circuit (12), characterized in that conformation means (20) has at least one bent spring strip (24) comprising at least one bend (26) positioned between flex circuit (12) and a surface (28) so as to increase the elastic effect of said strip (24).

18 Claims, 7 Drawing Sheets

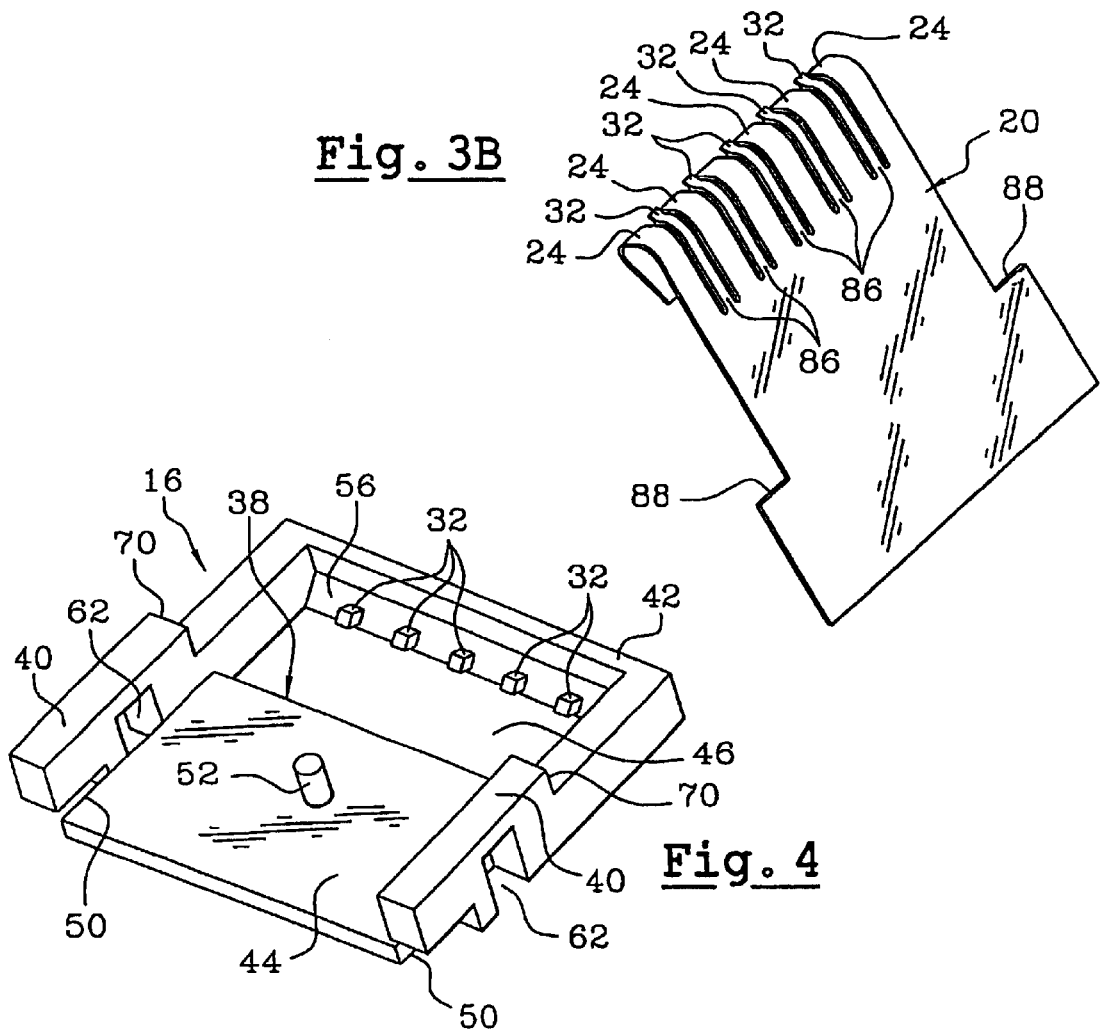
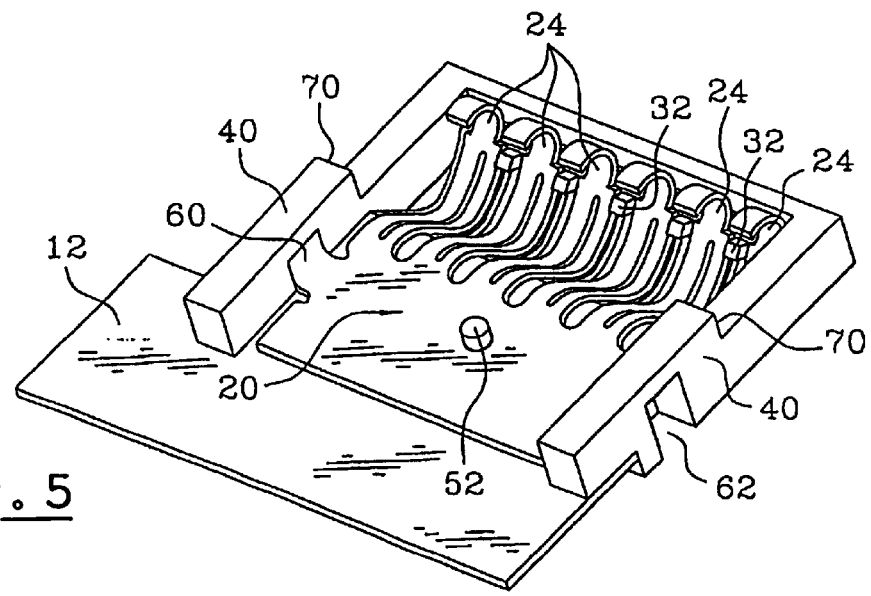

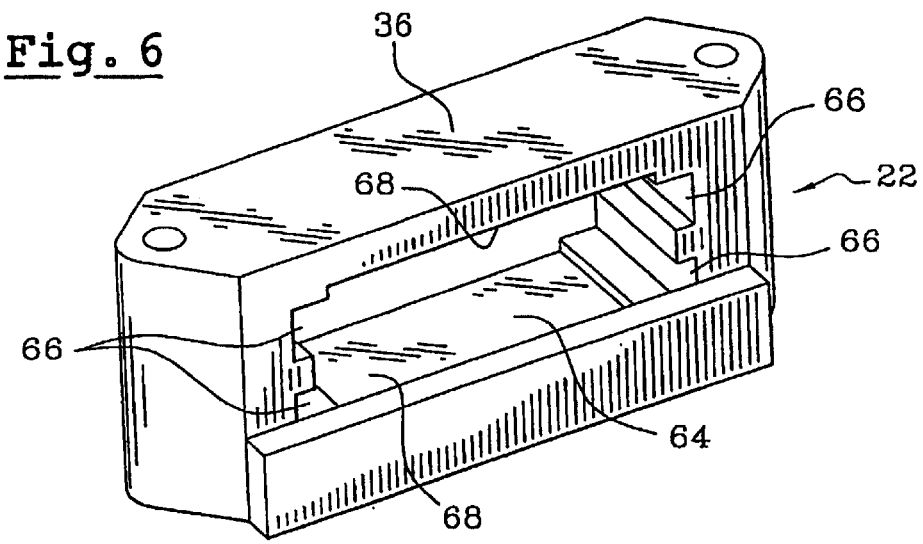
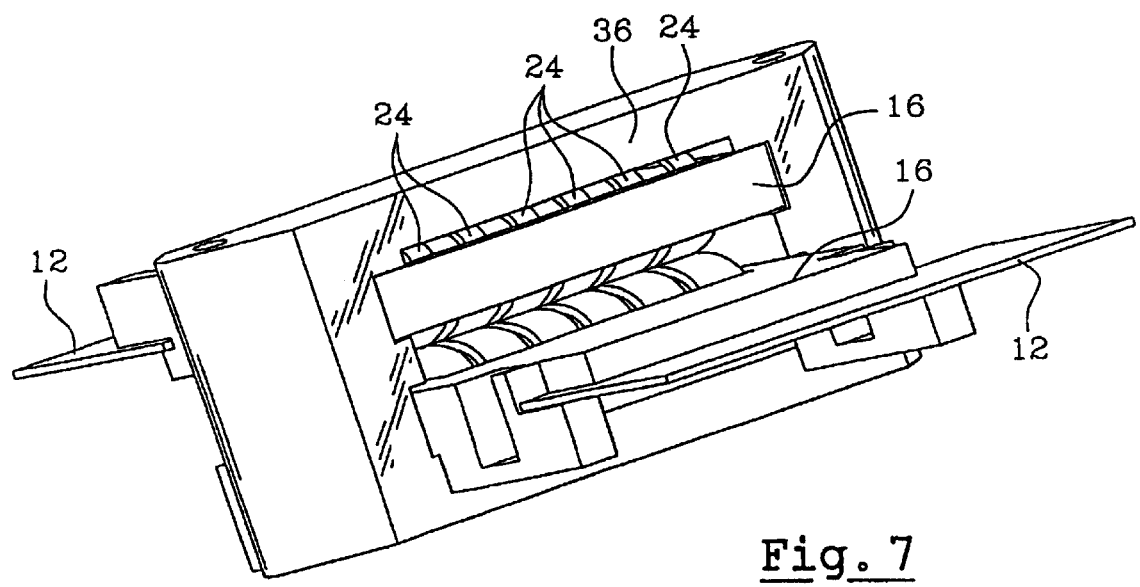

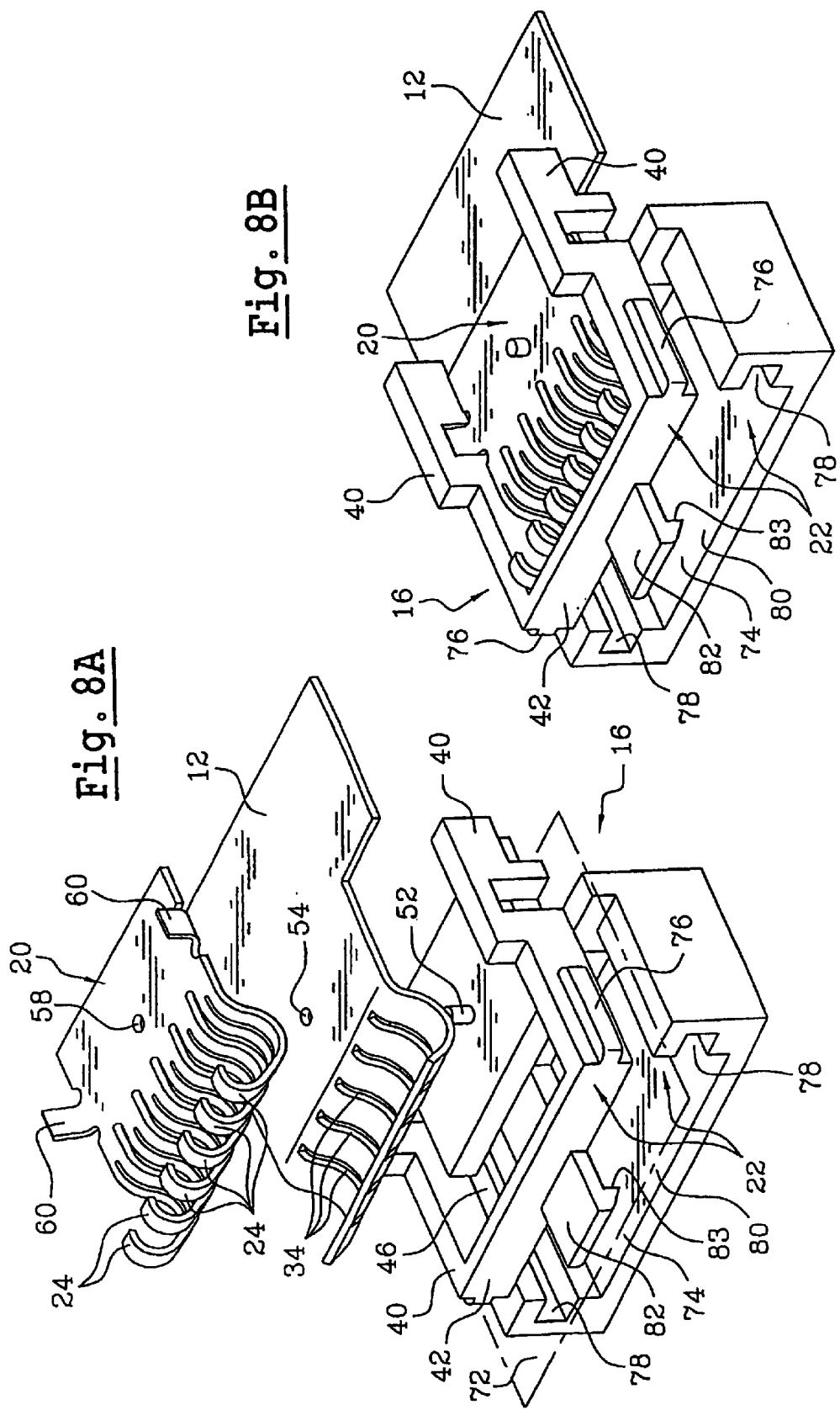

CONNECTION DEVICE FOR FLEXIBLE CIRCUIT

FIELD OF THE INVENTION.

The present invention relates to a connection device for a flex circuit, designed to assure the connection of two flex circuits, each of them being equipped with said device.

BACKGROUND OF THE INVENTION.

Document U.S. Pat. No. 3,082,398 describes such a device positioned at the end of each flex circuit, both devices being held level with one another, assuring a direct contact between the flex circuits.

According to this arrangement, each device comprises a head that can receive the flex circuit, the circuit being bent to cover both surfaces of the head and being immobilized relative to transverse translation between the lateral edges of the head.

An elastic element, in the form of an elastic strip, positioned between the head and the flex circuit, is provided to reinforce the contact pressure between the two flex circuits.

For this purpose, a U-shaped piece of sheet metal is fitted onto the end of the head and comprises cut-outs that delimit elastic strips which work by flexing in the zone interposed between the head and the flex circuits. According to this embodiment, only one arm of the U is positioned between the support and the flex circuit.

In order to assure their support, the two devices are plugged into a retaining element, the flex circuits being pressed flat against one another by means of the elastic strips.

This arrangement is not completely satisfactory since it only procures a mediocre electrical contact between the two flex circuits, and this contact deteriorates over time.

Moreover, this arrangement does not assure an optimal positioning between the two flex circuits, since these circuits are simply immobilized between the lateral edges of the heads, with the result that the electrical components of both flex circuits cannot be positioned level with to one another.

SUMMARY OF THE INVENTION.

Thus, the present invention seeks to alleviate the disadvantages of the prior art by proposing a connection device for a flex circuit, designed to assure the direct connection of two flex circuits, each of them being equipped with said device, procuring a superior quality of electrical contact, which is practically constant over time, and assuring an optimal relative positioning of the conductors.

For this purpose, the object of the invention is a connection device for a flex circuit, comprising a support, means for positioning the flex circuit relative to said support, and conformation means for said flex circuit, characterized in that the conformation means have at least one curved spring strip with at least one fold or bend disposed between the flex circuit and a surface so as to increase the elastic effect of said strip.

This arrangement permits obtaining a better quality of contact due to a greater contact pressure that is also stronger over time.

Preferably, the means for positioning the flex circuit relative to the support comprise projections downstream of the contact zone, along the direction of plugging in, which projections can be housed in corresponding openings created in the flex circuit.

This arrangement contributes to improving the contact quality by positioning the flex circuit flat in a secure manner in the contact zone.

Advantageously, the openings created in the flex circuit have an oblong shape and are arranged parallel to the conductors of the flex circuit, in the vicinity of the gaps, so as to perfectly immobilize the flex circuit in the transverse direction and to permit a slight translation in the longitudinal direction.

According to a first variant, the projections are connected to the support. In this case, according to a preferred embodiment, the support comprises an opening at a right angle to the contact zone, the edge of the opening having an inclined plane downstream, on which the projections are attached.

According to another variant, the projections are attached onto the conformation means. In this case, according to a preferred embodiment, the conformation means comprise a first set of curved elastic strips and a second set of strips interposed between the strips of the first set whose ends form the projections which can be housed in the openings of the flex circuit.

In order to improve the positioning of the flex circuit, the positioning means for the flex circuit relative to the support comprise elements positioned upstream of the contact zone of the flex circuit.

According to another characteristic of the invention, the device comprises means for positioning a support for another connection device to which it is able to be connected.

Advantageously, the support comprises complementary shapes on either side of a roughly median plane, assuring the relative positioning of two supports, the two identical supports being positioned head-to-foot.

According to a preferred embodiment, the support comprises, on the one hand, a receptacle receiving the flex circuit and conformation means, and, on the other hand, a housing able to receive the receptacle of a second support when both devices are connected head-to-foot.

According to another embodiment, the support is presented in the form of a U whose base supports the flex circuit and conformation means and whose arms have complementary forms that can assure the relative positioning between supports.

According to another variant, the connection device comprises an element distinct from the support and this element assures the positioning and retaining in position of two connected supports.

BRIEF DESCRIPTION OF THE DRAWINGS.

Other characteristics and advantages will become apparent from the description that follows, which is given solely by way of example and with reference to the attached drawings, in which:

FIG. 3B is a perspective view illustrating another variant of the conformation means, FIG. 4 is a perspective view illustrating a first variant of the support for the connection device of the invention, FIG. 5 is a perspective view of a connection device comprising a support according to FIG. 4, FIG. 6 is a perspective view illustrating a retaining element for two devices according to FIG. 5, FIG. 7 is a perspective view illustrating the connection between two devices according to FIG. 5, FIG. 8A is a perspective and exploded view of the elements making up a device of the invention according to a second variant, FIG. 8B is a perspective view of the device of FIG. 8A mounted.

DETAILED DESCRIPTION OF THE INVENTION.

Figure 1:
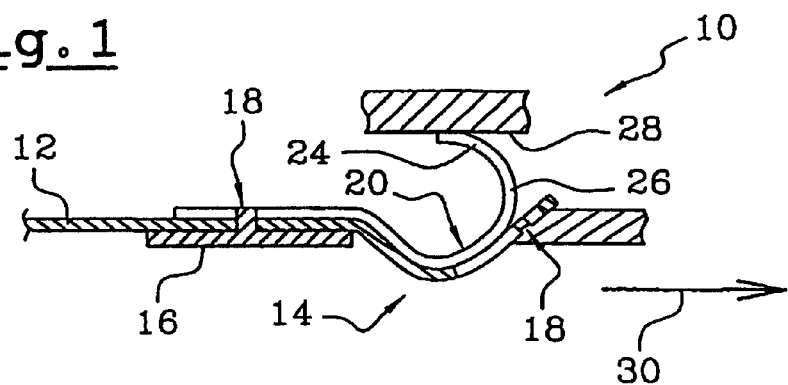
FIG. 1 is a schematic and simplified view of the connection device of the invention.
Figure 2:
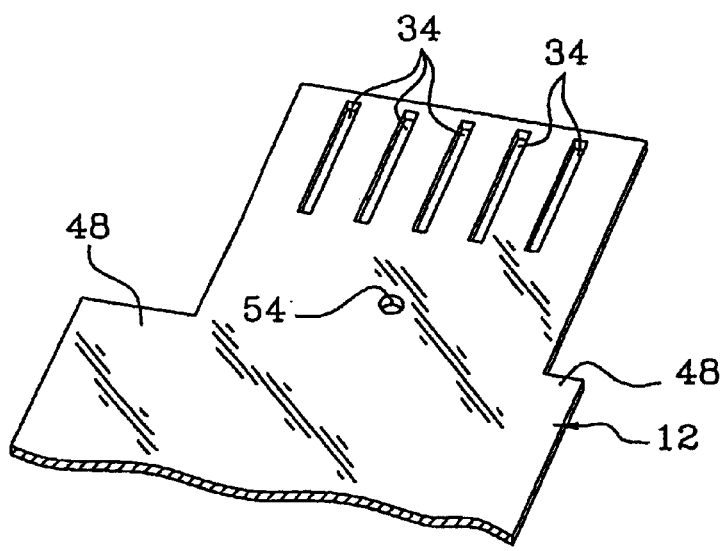
FIG. 2 is a perspective view of a flex circuit.

A connection device 10 according to the invention for a flex circuit 12 that can be connected to an analogous connection device provided on another flex circuit is shown in FIG. 1 in a schematic and simplified manner.

In a known way, a flex circuit generally comprises conductors or tracks, spaced roughly parallel to each other and embedded in an insulating constituent forming a substrate. In order to assure a connection between two flex circuits, the conductors of each flex circuit are stripped on one side of said circuit at the level of a contact zone 14 so as to permit electrical continuity.

Connection device 10 comprises a support 16, means 18 for positioning flex circuit 12 relative to said support 16 and conformation means 20 for flex circuit 12 in contact zone 14. It also comprises means 22 for positioning a support for another connection device to which it can be connected.

According to the invention, conformation means 20 comprises an elastic element having at least one bent spring strip 24 comprising at least one bend 26 positioned between flex circuit 12 and a surface 28 so as to increase the elastic effect of said strip 24 thus procuring a contact pressure that becomes greater and stronger over time. According to the invention, the two arms coming from bend 26 of each strip are positioned between the flex circuit and surface 28. Preferably, a number of strips equal to the number of conductors of the flex circuit is provided, these latter each being positioned at a right angle to said conductors.

In order to assure an optimal connection, it is necessary not only to exert a high contact pressure, but also to correctly position the two flex circuits relative to one another. This is especially important when circuit 12 is flexible and susceptible to being bent back rather than being positioned flat in contact zone 14.

For this purpose, means 18 for positioning flex circuit 12 are advantageously positioned upstream and downstream of contact zone 14 (according to the plugging-in direction 30).

Downstream, positioning means 18 comprise projections 32 which can be housed in corresponding openings 34 arranged in flex circuit 12. Depending on the case, as will be discussed in detail further on, these projections 32 can be attached onto support 16 or even onto conformation means 20. The number of projections 32 is preferably equal to the number of gaps between the conductors of flex circuit 12, the openings 34 being positioned at the level of each gap.

The fact of positioning the flex circuit positioning means downstream permits assuring in a secure manner the flat positioning of the flex circuit in the contact zone and thus a correct relative positioning between the two flex circuits placed in contact.

In order for these flex circuits to be properly positioned relative to one another, it is also necessary to assure a correct relative positioning between supports 16 of two connected devices.

According to the invention, relative positioning means 22 for the supports are made up in shapes adapted to each support. Advantageously, the support shapes are such that they permit connecting two identical supports, these latter being positioned head-to-foot.

Depending on the case, as will be described in more detail below, the shapes of the support are also designed to assure the holding of the two devices in connected position, or a specific element 36 is provided to hold both devices in the connected position.

A first variant is illustrated by FIGS. 2, 3A, 4, 5, 6 and 7.

According to this embodiment, projections 32 are attached at the level of support 16 as illustrated by FIG. 4 and a specific element 36 is provided for keeping the connected devices in contact, illustrated by FIG. 6.

In FIG. 4, support 16 is shown in detail; it comprises a receptacle 38 delimited by lateral walls 40, a distal wall 42 and a bottom 44 at the level of which an opening 46 is created at a right angle to contact zone 14, flex circuit 12 being immobilized between conformation means 20 and bottom 44.

Flex circuit 12 is immobilized between lateral walls 40 and comprises a shoulder 48 at the level of each lateral edge (visible in FIG. 2) and this shoulder can be immobilized in a slot 50 created in the lower part of lateral walls 40 and supported against said lateral walls. In complement, in order to reinforce positioning means 18 and assure an easier mounting, a projection 52 in one piece with bottom 44 is provided and this projection can be housed in an opening 54 created in the flex circuit.

According to this embodiment, means 18 for positioning flex circuit 12 relative to support 16 also comprises projections 32 in one piece with bottom 44 downstream of opening 46, the edge of opening 46 having downstream an inclined plane 56 fitted to conformations means 20.

Flex circuit 12 comprises oblong openings 34, parallel to the conductors, positioned at the level of the gaps, into each of which a projection 32 can be translated. According to this arrangement, the downstream part of flex circuit 12 is perfectly immobilized relative to transverse translation, but can possibly be translated in the longitudinal direction depending on the deformation of conformation means 20.

Figure 3A:
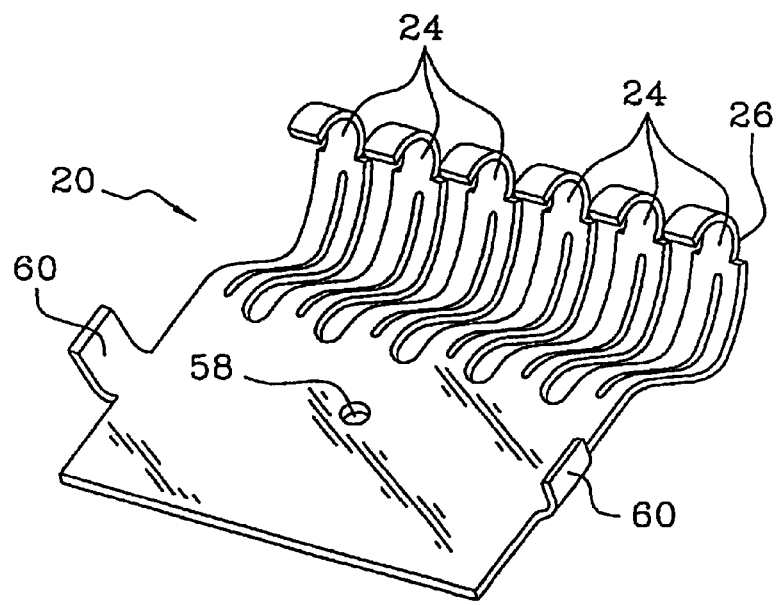
FIG. 3A is a perspective view illustrating a first variant of the conformation means.

As illustrated by FIG. 3A, conformation means 20 is presented in the form of a piece of sheet metal in which a plurality of elastic bent strips 24 are cut out, preferably of a number equal to the conductors and positioned level with the latter.

At the level of the end opposite the strips, the sheet metal piece comprises an opening 58 in which support projection 52 can be housed and two tabs 60 positioned at the level of each lateral edge, each of which is immobilized in a respective housing 62, created at the level of lateral walls 40, in a manner so as to assure a connection by ratcheting said conformation means and the support.

This embodiment comprises a specific retaining element 36 for keeping two connection devices in contact, illustrated by FIG. 6, having an opening 64 in which two connection devices can be plugged, two grooves 66 being provided on each side in order to receive lateral walls 40 of each support 16 so as to obtain a sliding connection between the support and retaining element 36.

According to this embodiment, the ends of the bent flexible strips can be supported against upper or lower walls 68 of retaining element 36 that fulfills the function of surface 28 of FIG. 1, in order to obtain contact pressure.

Finally, lateral walls 40 of supports 16 have fitted shapes, a shoulder 70 that can be supported against retaining element 36 to assure immobilization relative to longitudinal translation of said support 16, when contact zones 14 of each device are positioned level with one another.

This embodiment procures not only an optimal contact quality due to the combination of the increased elastic effect and the means for positioning flex circuits, but also a great ease of mounting.

Thus, flex circuit 12 is introduced into slots 50 of support 16 until shoulders 48 come to be supported against lateral walls 40, and support projections 32 and 52 are introduced into respective openings 34 and 54 of the flex circuit.

In order to hold and conform flex circuit 12, conformation means 20 is positioned in receptacle 38 of support 16, support projection 52 coming to be housed in opening 58 and tabs 60 coming to be immobilized by ratcheting in respective housings 62. This assembly is illustrated by FIG. 5.

The bent form of strips 24 conforms flex circuit 12, notably in contact zone 14, so that flex circuit 12 comes out of opening 46, in order to be in a slightly projecting position relative to the bottom of support 16. As illustrated by FIG. 7, the ends of strips 24 come to be supported against the upper or lower wall of retaining element 36 and assure an increased contact pressure when the contact zones of each device are positioned level with one another.

A second variant is illustrated by FIGS. 2, 3A, 8A, 8B, 9A and 9B. According to this embodiment, projections 32 are attached at the level of support 16 as for the first variant and the shapes of support 16 are provided not only to assure a correct positioning between two supports connected in head-to-foot position, but also to assure the retention of said supports in this position.

Flex circuit 12 and conformation means 20 are preferably identical to those of the first variant, the identical elements being referenced as previously.

Support 16, illustrated by FIG. 8A, comprises a receptacle 38 identical to the first variant, with projections 32, 52 and an opening 46, which are identical and arranged in the same manner.

As illustrated by FIGS. 8A and 8B, flex circuit 12 and conformation means 20 are mounted in an identical manner.

According to this variant, support 16 has complementary shapes positioned on either side of a plane 72 positioned roughly at the level of bottom 44 of the receptacle, on one side of which is receptacle 38 as defined previously and on the other side of which is a housing 74 that can receive, preferably in a fitted manner, receptacle 38 of a second support when two devices are connected head-to-foot.

In order to assure a better relative positioning between the supports and better guidance during their mutual insertion, the outer flanks of lateral walls 40 each have a rib 76 that can slide into a groove 78 created at the level of each lateral wall of housing 74.

According to this embodiment, the ends of strips 24 of the first support are supported against surface 80 of housing 74 opposite opening 46 of the second support, this surface 80 fulfilling the function of surface 28 of FIG. 1.

Figure 9A:
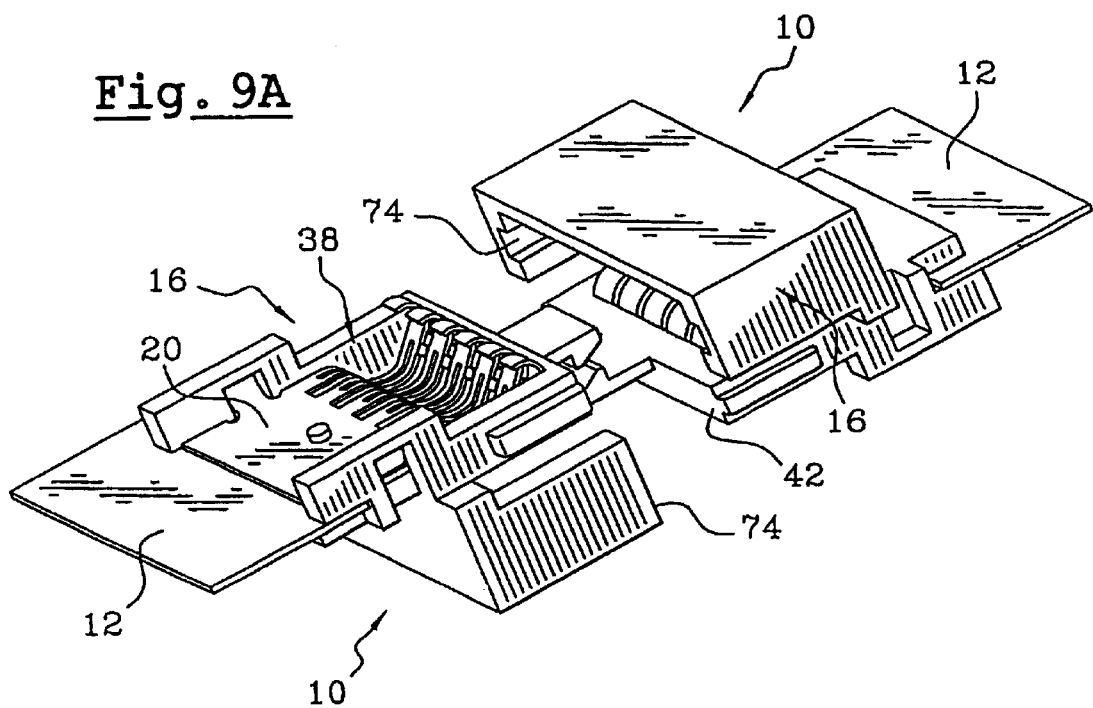
FIGS. 9A and 9B are perspective views of two devices according to the second variant ready to be connected as well as connected, respectively.
Figure 9B:
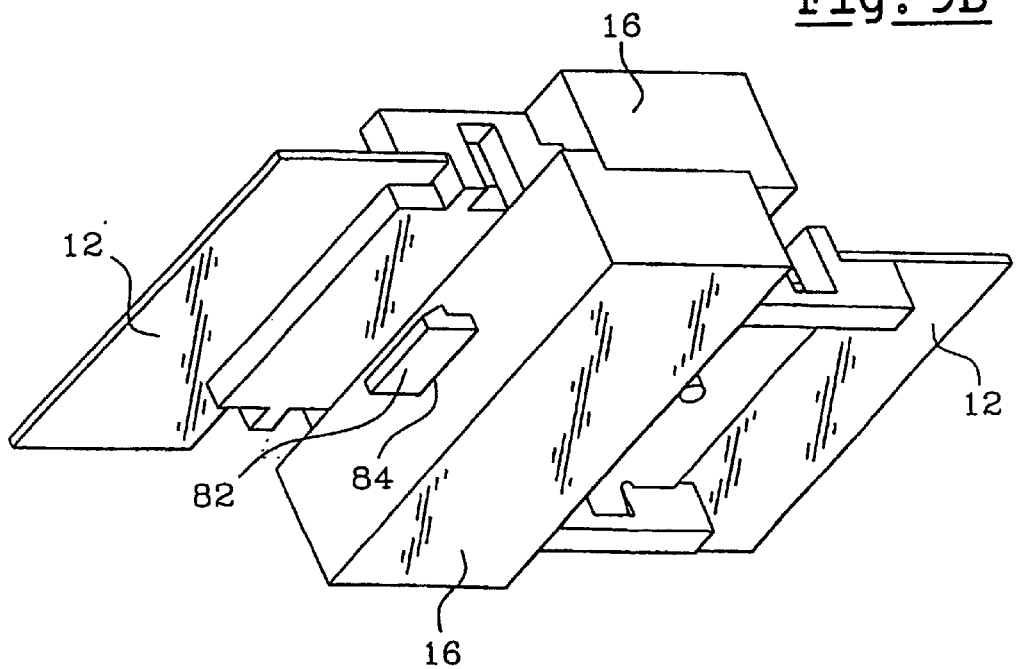

In order to retain the devices in the connected position in a secure manner, support 16 comprises a tab 82 at the level of the outer surface of distal wall 42, which tab is provided at its end with a projection 83 that can be housed and immobilized by ratcheting in an opening 84 created at the level of the bottom of housing 74 as shown by FIG. 9B.

According to this variant, as illustrated by FIGS. 9A and 9B, identical supports are first presented and then connected head-to-foot.

A third variant is shown in FIGS. 2, 3B, 10, 11A and 11B. According to this embodiment, projections 32 are attached at the level of conformation means 20 as illustrated by FIG. 3B and the shapes of support 16 are provided not only to assure a correct positioning between two supports connected in head-to-foot position, but also in order to assure the retention of said supports in this position.

Flex circuit 12 has a form identical to those of the preceding variants.

According to this embodiment, conformation means 20, illustrated by FIG. 3B, comprises a first set of bent elastic strips 24 having a function identical to the bent strips of the preceding variants and a second set of strips 86 interposed between the preceding ones whose ends form projections 32 that can be housed in oblong openings 34 of flex circuit 12. Preferably, the number of first strips 24 is equal to the number of conductors of the flex circuit and the number of second strips 86 is equal to the number of gaps provided between the conductors. Advantageously, conformation means 20 has at the level of its lateral edges, shapes that can be superimposed with those of flex circuit 12, comprising a shoulder 88 on each side.

According to this variant, support 16 is presented in the form of a U whose base 90 comprises means 18 for positioning flex circuit 12 and conformation means 20 and whose arms 92 and 94 have complementary shapes assuring the relative positioning of the two connected supports and their retention in this position.

Base 90 comprises an opening 96 permitting the introduction of flex circuit 12 and conformation means 20 between arms 92 and 94. This opening 96 comprises slots 98 at the level of the outer surface of base 90 and these slots can receive the lateral edges of the flex circuit and the conformation means; said slots 98 do not extend through the entire thickness of base 90 in order to constitute a support zone for shoulders 48 and 88.

Figure 11A:
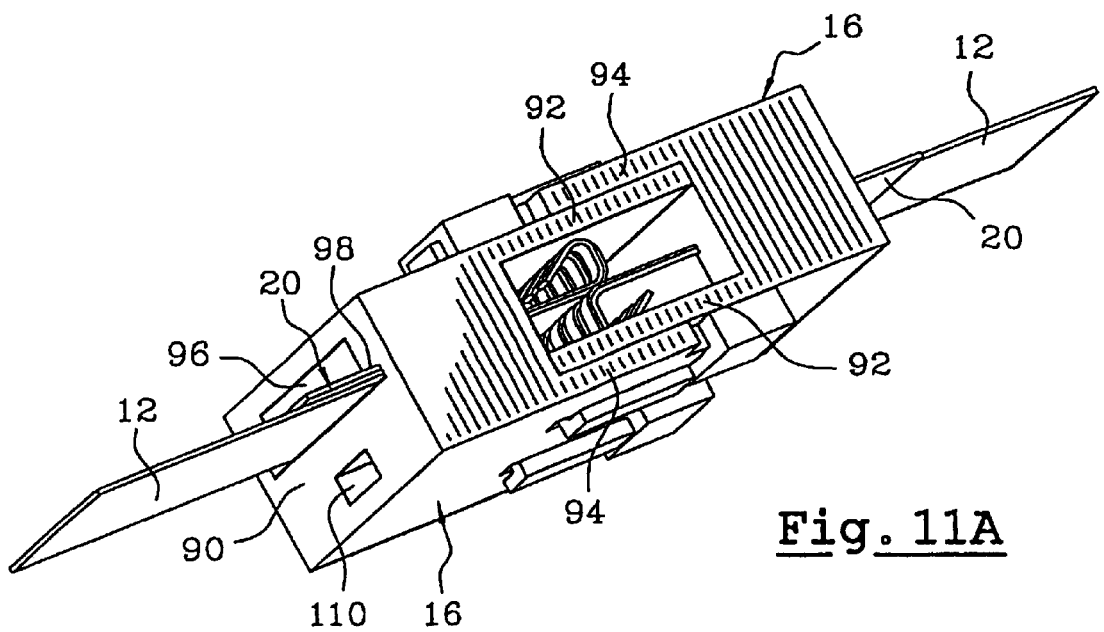
FIGS. 11A and 11B are views, at two different angles, illustrating two connected devices according to the third variant.

Slots 98 are positioned in a manner so that the ends of strips 24 take support against one of the support arms, fulfilling the function of surface 28 of FIG. 1, so as to exert an elastic effect on flex circuit 12, this circuit being distanced from the second arm so as to permit the introduction of an arm, a flex circuit, and conformations means of another connection device, as illustrated by FIG. 11A.

The shapes of arms 92 and 94 are complementary so as to assure the positioning and retention of two devices connected head-to-foot.

Figure 10:
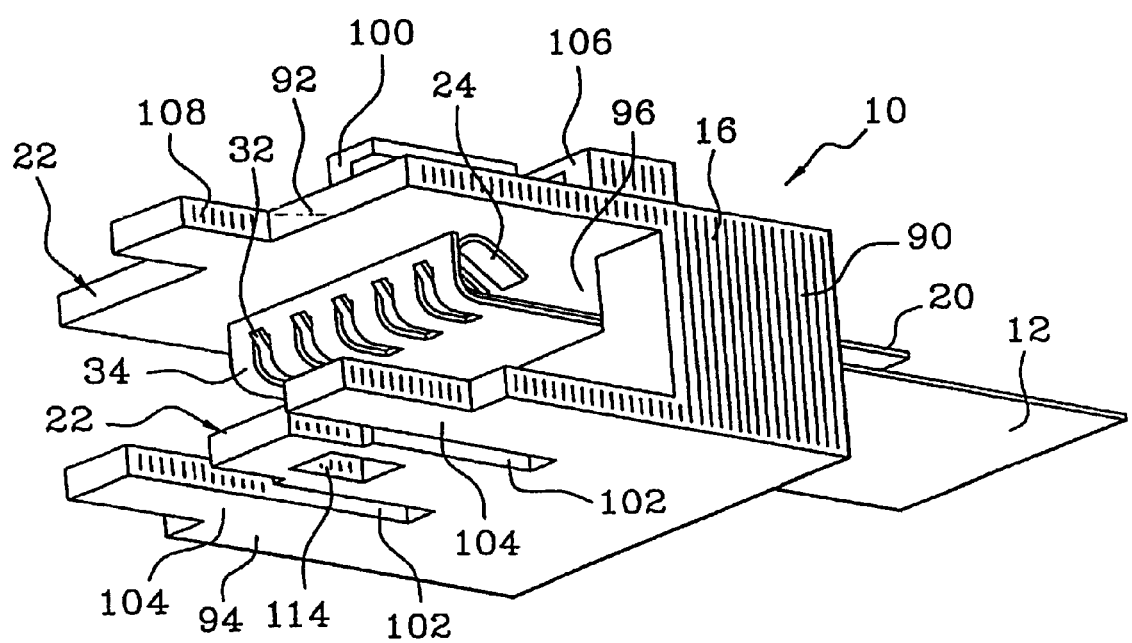
FIG. 10 is a perspective view illustrating a third variant of a device.
Figure 11B:
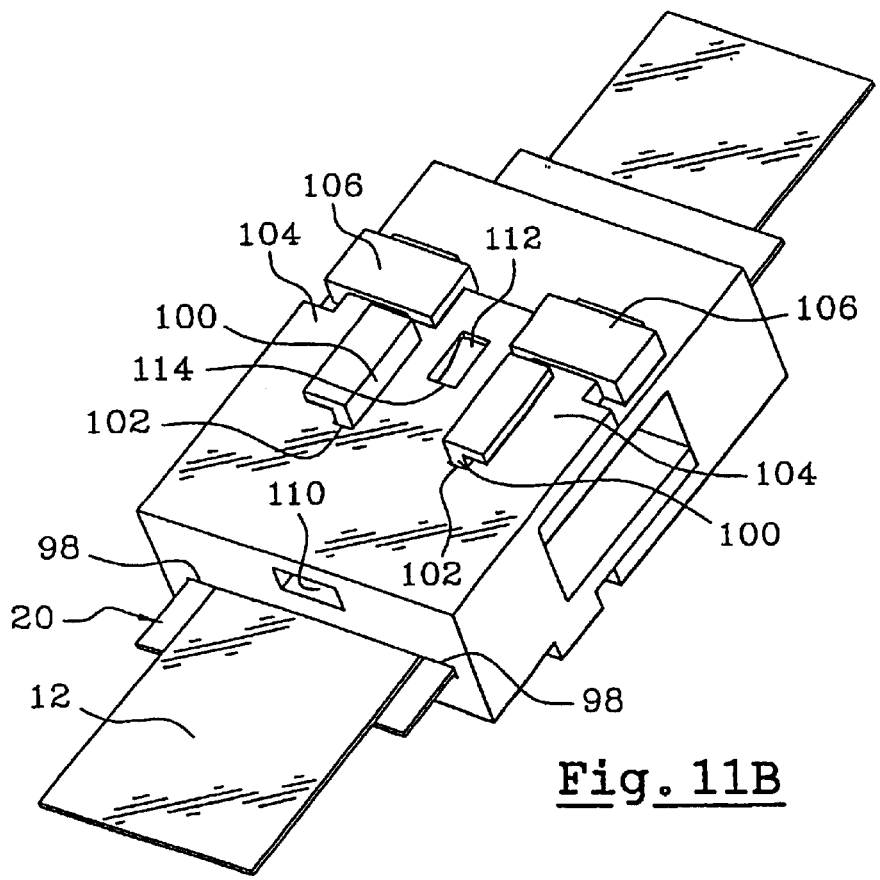

According to a preferred embodiment, illustrated by FIGS. 10, 11A and 11B, the first arm 92 serving for support comprises two ribs 100 positioned on the outer surface of said arm, in a symmetric manner relative to a median plane, and these ribs can be housed in two slots 102 created in second arm 94, these slots 102 delimiting two arms 104 on either side. Advantageously, ribs 100 have an L-shape that can retain arms 104.

Complementary to this, the ends of arms 104 can be plugged into housings 106 created at the level of the outer surface of the first arm 92.

Moreover, the front end of arm 92 has a stud 108 that can be housed in an opening 110 created in base 90, visible in FIG. 11A.

These elements 100 to 110 contribute to assuring an optimal positioning between the supports connected head-to-foot.

In order to keep the devices secure in the connected position, a projection 112 is created on the outer surface of one of arms 92 or 94 that can be housed by ratcheting in a housing 114 created on the inner surface of the other arm.

As illustrated in FIGS. 11A and 11B, identical supports are mutually housed, one within another, so as to obtain a connection box.

Of course, the invention is obviously not limited to the embodiment shown and described above, but on the contrary covers all variants, notably relative to the number of conductors of the flex circuit, the dimensions and materials of the different constituents as well as the support shapes, which may or may not have identical shapes.

Moreover, the support shapes of the first and second variants can be adapted to accommodate conformation means 20 according to the third variant.

Finally, although the device of the invention has been shown at the end of the flex circuit in all of the figures, the device can be positioned in any other place on the flex circuit with slight modifications of the support.

The invention claimed is:

1. A connection device for flex circuit, comprising a support, means for positioning said flex circuit relative to said support and conformation means for said flex circuit, characterized in that the support has a bottom at a level of which is created an opening, said flex circuit being immobilized between said conformation means and said bottom, said conformation means having at least one bent spring strip comprising at least one bend positioned between said flex circuit and a surface so as to increase elastic effect of said strip, wherein the connection device is adapted to removably plug the support with the flex circuit into a receiving slot of another member.

2. The connection device according to claim 1, further characterized in that said means for positioning flex circuit relative to said support comprises projections downstream of a contact zone, in a plugging-in direction, which projections can be housed in corresponding openings created in said flex circuit.

3. The connection device according to claim 2, further characterized in that said openings created in said flex circuit have an oblong form and are arranged parallel to flex circuit conductors, at the level, so as to immobilize the flex circuit in a transverse direction and permit a slight translation in a longitudinal direction.

4. The connection device according to claim 2, further characterized in that said projections are attached onto said support.

5. The connection device according to claim 4, further characterized in that an edge of said opening having an inclined plane downstream and said projections are attached on this plane.

6. The connection device according to claim 2, further characterized in that said projections are attached onto said conformation means.

7. The connection device according to claim 1, further characterized in that said means for positioning said flex circuit relative to said support comprises elements positioned upstream of a contact zone of said flex circuit.

8. The connection device according to claim 7, further characterized in that said positioning means positioned upstream comprises a projection in one piece with said support that can be housed in an opening created in said flex circuit.

9. The connection device according to claim 1, further characterized in that said conformation means retains and supports said flex circuit against said support and for this purpose has means for connection to said support by ratcheting.

10. The connection device according to claim 1, further characterized in that the connection device comprises means for positioning a support of another connection device to which it can be connected.

11. The connection device according to claim 10, further characterized in that said support comprises complementary shapes on either side of a roughly median plane assuring be relative positioning of said two supports, the two supports being positioned head-to-foot.

12. The connection device according to claim 11, further characterized in that said support comprises, on one side, a receptacle receiving flex circuit as well as conformation means, and, on the other side, a housing that can receive said receptacle of a second support when said two devices are connected head-to-foot.

13. The connection device according to claim 11, further characterized in that said support is presented in the form of a U whose base supports said flex circuit as well as said conformation means and whose arms have complementary shapes that can assure relative positioning between supports.

14. The connection device according to claim 11, further characterized in that the support comprises means for retaining in the connected position.

15. The connection device according to claim 14, further characterized in that the support comprises a projection and a corresponding housing or opening, said projection of a first support being able to be immobilized by ratcheting in a housing or opening of a second support.

16. The connection device according to claim 10, further characterized in that the connection device comprises a separate element assuring the positioning and holding in position of said two connected supports.

17. A connection device for flex circuit, comprising a support, means for positioning said flex circuit relative to said support and conformation means for said flex circuit, characterized in that the support has a bottom at a level of which is created an opening, said flex circuit being immobilized between said conformation means and said bottom, said conformation means having at least one bent spring strip comprising at least one bend positioned between said flex circuit and a surface so as to increase elastic effect of said strip, further characterized in that said conformation means comprise a first set of bent elastic strips and a second set of strips interposed between the strips of the first set whose ends form projections that can be housed in openings of the flex circuit.

18. A connection device for a flex circuit, the connection device comprising:
   a support;
   a positioning system for positioning the flex circuit relative to the support; and
   a conformer connected to the support and contacting the flex circuit,
   wherein the support has a bottom with an opening, wherein the flex circuit is substantially permanently immobilized between the conformer and the bottom, wherein the conformer has at least one bent spring strip comprising at least one bend positioned between the flex circuit and a surface of the support so as to increase elastic effect of the strip, and wherein the connection device is adapted to removably plug the support with the flex circuit to another member.

* * * * *